(12) United States Patent
Fan et al.

(10) Patent No.: US 11,764,302 B2
(45) Date of Patent: Sep. 19, 2023

(54) THIN FILM TRANSISTOR

(71) Applicant: Au Optronics Corporation, Hsinchu (TW)

(72) Inventors: Yang-Shun Fan, Hsinchu (TW); Chen-Shuo Huang, Hsinchu (TW)

(73) Assignee: AU OPTRONICS CORPORATION, Hsinchu (TW)

(*) Notice: Subject to any disclaimer, the term of this patent is extended or adjusted under 35 U.S.C. 154(b) by 0 days.

(21) Appl. No.: 17/510,417

(22) Filed: Oct. 26, 2021

(65) Prior Publication Data
US 2023/0084510 A1    Mar. 16, 2023

(30) Foreign Application Priority Data
Sep. 13, 2021 (TW) ................. 110134028

(51) Int. Cl.
*H01L 29/786* (2006.01)
*H01L 29/417* (2006.01)

(52) U.S. Cl.
CPC .. *H01L 29/78645* (2013.01); *H01L 29/41733* (2013.01); *H01L 29/78603* (2013.01)

(58) Field of Classification Search
CPC ......... H01L 29/78645; H01L 29/41733; H01L 29/78603
See application file for complete search history.

(56) References Cited

U.S. PATENT DOCUMENTS

| | | | |
|---|---|---|---|
| 6,252,248 B1 | 6/2001 | Sano et al. | |
| 10,504,984 B2 | 12/2019 | Gu | |
| 11,081,594 B2 | 8/2021 | Choi et al. | |
| 2012/0153289 A1* | 6/2012 | Kaneko | H01L 29/78633 257/E33.012 |
| 2016/0365458 A1 | 12/2016 | Shi et al. | |

FOREIGN PATENT DOCUMENTS

| | | |
|---|---|---|
| CN | 104538458 | 4/2015 |
| CN | 111354787 | 6/2020 |
| WO | 2018205613 | 11/2018 |

* cited by examiner

Primary Examiner — Mohammed R Alam
(74) Attorney, Agent, or Firm — JCIPRNET

(57) ABSTRACT

A thin film transistor includes a semiconductor layer, a first gate electrode disposed at one side of the semiconductor layer, a first gate insulating layer disposed between the first gate electrode and the semiconductor layer, a second gate electrode and a third gate electrode disposed at another side of the semiconductor layer, and a second gate insulating layer. The second gate electrode is separated from the third gate electrode. The second gate insulating layer is disposed between the second and third gate electrodes and the semiconductor layer. An orthogonal projection of the first gate electrode on the semiconductor layer is partially overlapped with an orthogonal projection of the second gate electrode on the semiconductor layer. The orthogonal projection of the first gate electrode on the semiconductor layer is partially overlapped with an orthogonal projection of the third gate electrode on the semiconductor layer.

11 Claims, 2 Drawing Sheets

THIN FILM TRANSISTOR

CROSS-REFERENCE TO RELATED APPLICATION

This application claims the priority benefit of Taiwanese application no. 110134028, filed on Sep. 13, 2021. The entirety of the above-mentioned patent application is hereby incorporated by reference herein and made a part of this specification.

BACKGROUND

Technical Field

The disclosure relates to a switch element. Particularly, the disclosure relates to a thin film transistor.

Description of Related Art

With the continual reduction of the feature size of thin film transistors, drain-induced barrier lowering (DIBL) may no longer be ignorable. The DIBL may change a threshold voltage of the thin film transistor, thus worsening the control ability of the gate electrode, which hinders the application to advanced circuit designs, such as pixel compensation in an AMOLED, a pulse width modulation (PWM) pixel circuit in a micro-LED, and the like. Therefore, how to suppress DIBL is still one of the objects for improvement sought by practitioners in the related industry.

SUMMARY

The disclosure provides a thin film transistor, capable of suppressing drain-induced barrier lowering (DIBL).

An embodiment of the disclosure provides a thin film transistor, including a semiconductor layer, a first gate electrode, a first gate insulating layer, a second gate electrode, a third gate electrode, and a second gate insulating layer. The first gate electrode is disposed at one side of the semiconductor layer. The first gate insulating layer is disposed between the first gate electrode and the semiconductor layer. The second gate electrode and the third gate electrode are disposed at another side of the semiconductor layer. The second gate electrode is separated from the third gate electrode. The second gate insulating layer is disposed between the semiconductor layer, and the second gate electrode and the third gate electrode. An orthogonal projection of the first gate electrode on the semiconductor layer is partially overlapped with an orthogonal projection of the second gate electrode on the semiconductor layer. The orthogonal projection of the first gate electrode on the semiconductor layer is partially overlapped with an orthogonal projection of the third gate electrode on the semiconductor layer.

In an embodiment of the disclosure, a ratio of a sum of an overlapping area of the second gate electrode with the semiconductor layer and with the first gate electrode and an overlapping area of the third gate electrode with the semiconductor layer and with the first gate electrode to an overlapping area of the first gate electrode with the semiconductor layer is between 40% and 60%.

In an embodiment of the disclosure, the first gate electrode, the second gate electrode, and the third gate electrode are electrically connected.

In an embodiment of the disclosure, a central line of the first gate electrode is overlapped with a central line between the second gate electrode and the third gate electrode.

In an embodiment of the disclosure, a size of the second gate electrode is the same as a size of the third gate electrode.

In an embodiment of the disclosure, the second gate insulating layer covers the second gate electrode and the third gate electrode.

In an embodiment of the disclosure, a thickness of the second gate insulating layer is greater than a thickness of the first gate insulating layer.

In an embodiment of the disclosure, the thin film transistor further includes a source electrode. The source electrode is electrically connected to one end of the semiconductor layer. The orthogonal projection of the second gate electrode on the semiconductor layer is located between an orthogonal projection of the source electrode on the semiconductor layer and the orthogonal projection of the first gate electrode on the semiconductor layer.

In an embodiment of the disclosure, the thin film transistor further includes a drain electrode. The drain electrode is electrically connected to another end of the semiconductor layer. The orthogonal projection of the third gate electrode on the semiconductor layer is located between an orthogonal projection of the drain electrode on the semiconductor layer and the orthogonal projection of the first gate electrode on the semiconductor layer.

In an embodiment of the disclosure, a minimum distance between the second gate electrode and the third gate electrode is 1.2 μm.

In an embodiment of the disclosure, a material of the semiconductor layer includes an oxide semiconductor material, a silicon semiconductor material, or an organic semiconductor material.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
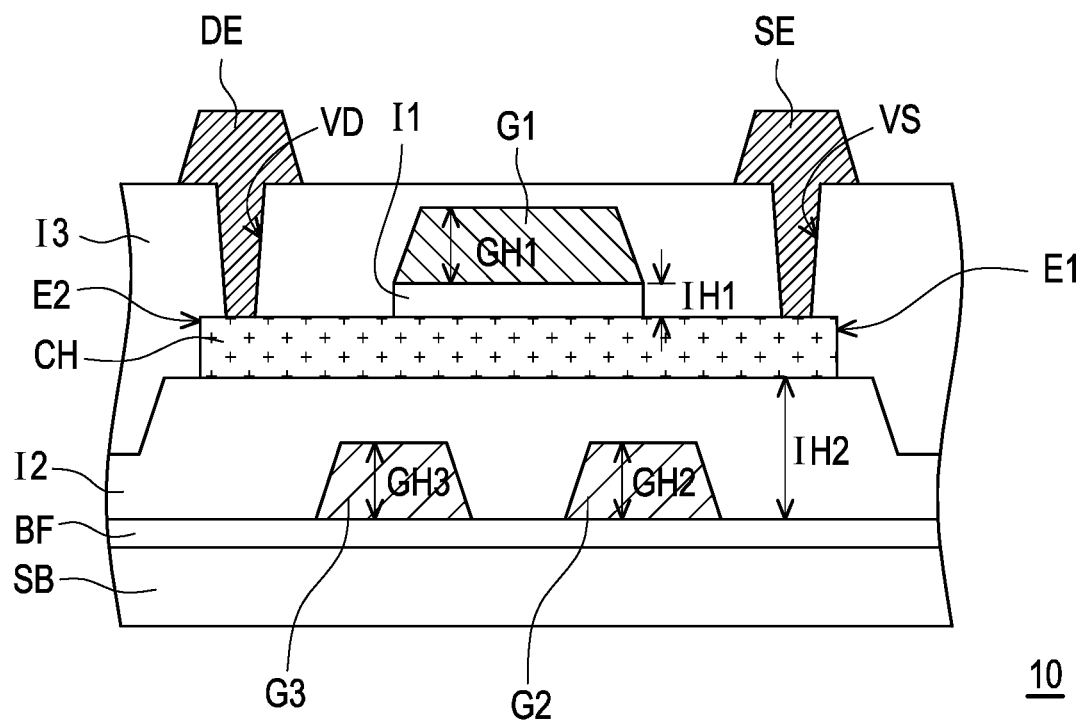
FIG. 1 is a schematic cross-sectional view of a thin film transistor 10 according to an embodiment of the disclosure.

In the drawings, thicknesses of layers, films, panels, regions, etc., are exaggerated for the sake of clarity. Throughout the specification and the appended claims, the same reference numerals denote the same elements. It should be understood that when an element such as a layer, film, region, or substrate is referred to as being "on", or "connected to" another element, it may be directly on or connected to another element, or intervening elements may also be present. In contrast, when an element is referred to as being "directly on" or "directly connected to" another element, no intervening elements are present. As used herein, the term "connection" may refer to physical and/or electrical connection. Furthermore, "electrical connection" or "coupling" may encompass the presence of other elements between two elements.

It should be understood that although the terms "first", "second", "third", etc. may be used herein for describing various elements, components, regions, layers, and/or portions, the elements, components, regions, layers, and/or portions are not limited by the terms. The terms are used merely for distinguishing one element, component, region, layer, or portion from another element, component, region, layer, or portion. Therefore, a first "element", "component", "region", "layer", or "portion" discussed below may also be referred to as a second element, component, region, layer, or portion without departing from the teaching of the disclosure.

The terminology used herein serves only for describing specific embodiments and is not intended to be restrictive. As used herein, the singular forms "a/an", "one", and "the" are intended to encompass the plural forms including "at least one", unless the context expressly indicates otherwise. The term "or" indicates "and/or". The term "and/or" used herein includes one or more relevant listed items or any or all combinations thereof. It should also be understood that the terms "comprise" and/or "include", when used herein, specifies the presence of the specified features, regions, entirety, steps, operations, elements, and/or components, but do not exclude the presence or addition of one or more other features, regions, entireties, steps, operations, elements, components, and/or combinations thereof.

Moreover, relative terms such as "lower" or "bottom" and "upper" or "top" may herein serve for describing the relation between one element and another element as shown in the drawings. It should also be understood that the relative terms are intended to include different directions of a device in addition to the direction as shown in the drawings. For instance, if a device in the drawings is turned upside down, an element described as being on the "lower" side of other elements shall be re-orientated to be on the "upper" side of the other elements. Thus, the exemplary term "lower" may include the orientations of "lower" and "upper", depending on the specific orientation of the drawings. Similarly, if a device in the drawings is turned upside down, an element described to be "below" or "beneath" other elements shall be re-orientated to be "above" the other elements. Therefore, the exemplary term "below" or "beneath" may include the orientations of above and below.

The term "about", "similar", or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For instance, "about" may mean within one or more standard deviations or within ±30%, ±20%, +10%, or ±5% of the stated value. Furthermore, a relatively acceptable range of deviation or standard deviation may be selected for the term "about", "similar", or "substantially" as used herein based on optical properties, etching properties, or other properties, instead of applying one standard deviation across all properties.

FIG. 1 is a schematic cross-sectional view of a thin film transistor 10 according to an embodiment of the disclosure. The thin film transistor 10 includes a semiconductor layer CH, a first gate electrode G1, a first gate insulating layer I1, a second gate electrode G2, a third gate electrode G3, and a second gate insulating layer I2. The first gate electrode G1 is disposed at one side of the semiconductor layer CH. The first gate insulating layer I1 is disposed between the first gate electrode G1 and the semiconductor layer CH. The second gate electrode G2 and the third gate electrode G3 are disposed at another side of the semiconductor layer CH. The second gate electrode G2 is separated from the third gate electrode G3. The second gate insulating layer I2 is disposed between the second and third gate electrodes G2, G3 and the semiconductor layer CH. An orthogonal projection of the first gate electrode G1 on the semiconductor layer CH is partially overlapped with an orthogonal projection of the second gate electrode G2 on the semiconductor layer CH. In addition, the orthogonal projection of the first gate electrode G1 on the semiconductor layer CH is partially overlapped with an orthogonal projection of the third gate electrode G3 on the semiconductor layer CH.

In the thin film transistor 10 of an embodiment of the disclosure, by disposing the separate second gate electrode G2 and third gate electrode G3 at the another side of the semiconductor layer CH opposite to the first gate electrode G1, the drain-induced barrier lowering (DIBL) can be suppressed. Implementations of the elements of the thin film transistor 10 accompanied with the drawings will be described below. Nonetheless, the disclosure is not limited thereto.

In this embodiment, the thin film transistor 10 may be disposed on a substrate SB. The material of the substrate SB may include glass. However, in some embodiments, the material of the substrate SB may also include quartz, organic polymers, opaque/reflective materials (e.g., wafers, ceramics, etc.), or other applicable materials. In some embodiments, a buffer layer BF may also be disposed between the thin film transistor 10 and the substrate SB to prevent impurities in the substrate SB from affecting the subsequently formed film layer.

The semiconductor layer CH of the thin film transistor 10 is disposed on the substrate SB. The material of the semiconductor layer CH may include oxide semiconductor materials, silicon semiconductor materials (e.g., polycrystalline silicon, amorphous silicon, etc.), or organic semiconductor materials. For example, the oxide semiconductor material may include, but is not limited to, at least one of IGZO (InGaZnO), IZO (InZnO), IGO (InGaO), ITO (InSnO), IGZTO (InGaZnSnO), GZTO (GaZnSnO), GZO (GaZnO), ZTO (ZnSnO), and ITZO (InSnZnO). The organic semiconductor materials may include, for example, various fused heterocycles (e.g., perylene imine and naphthalimide small molecules or polymers), polymers (e.g., polypyrrole and polyfuran), derivatives of the above materials, or other suitable materials or a combination of the above materials.

The first gate electrode G1, the second gate electrode G2, and the third gate electrode G3 of the thin film transistor 10 may be disposed at opposite sides of the semiconductor layer CH. In addition, the second gate electrode G2 and the third gate electrode G3 may be disposed at the same side of the semiconductor layer CH, and the first gate electrode G1 may be disposed at a different side from the second gate electrode G2 and the third gate electrode G3. For example, in this embodiment, the first gate electrode G1 may be disposed at an upper side, namely the side away from the substrate SB, of the semiconductor layer CH, and the second gate electrode G2 and the third gate electrode G3 may be disposed at a lower side, namely the side close to the substrate SB, of the semiconductor layer CH. In other words, the second gate electrode G2 and the third gate electrode G3 may be disposed between the semiconductor layer CH and the substrate SB, but are not limited thereto. In some embodiments, the first gate electrode G1 may be disposed at the lower side of the semiconductor layer CH, and the second gate electrode G2 and the third gate electrode G3 may be disposed at the upper side of the semiconductor layer CH. Moreover, orthogonal projections of the first gate electrode G1, the second gate electrode G2, and the third gate electrode G3 on the substrate SB are all located within an orthogonal projection of the semiconductor layer CH on the substrate SB.

Figure 2:
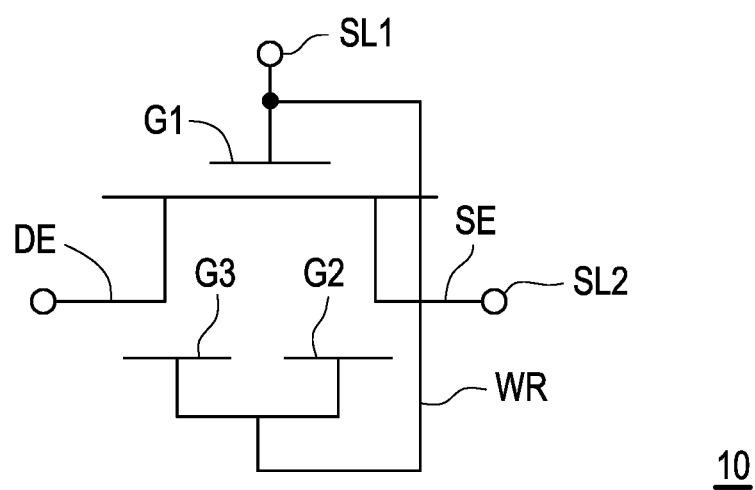
FIG. 2 is a schematic circuit block diagram of the thin film transistor 10 as shown in FIG. 1.

In this embodiment, the second gate electrode G2 and the third gate electrode G3 are physically separated, and the second gate electrode G2 and the third gate electrode G3 are electrically connected. FIG. 2 is a schematic circuit block diagram of the thin film transistor 10 as shown in FIG. 1. For example, in this embodiment, the first gate electrode G1, the second gate electrode G2, and the third gate electrode G3 may be electrically connected through a wire WR. When the first gate electrode G1, the second gate electrode G2, and the third gate electrode G3 receive a signal from a signal line SL1 and turn on the thin film transistor 10, a signal received by a source electrode SE from a signal line SL2 may be transmitted to a drain electrode DE through the semiconductor layer CH. In other embodiments, the first gate electrode G1, the second gate electrode G2, and the third gate electrode G3 may be electrically separated from each other.

In this embodiment, the materials of the first gate electrode G1, the second gate electrode G2, and the third gate electrode G3 may include metals with good conductivity, for example, copper (Cu), aluminum (Al), molybdenum (Mo), titanium (Ti), silver (Ag), chromium (Cr), or neodymium (Nd) or alloys of any combination of the above metals. In some embodiments, other conductive materials, for example, metal nitrides, metal oxides, metal oxynitrides, stacked layers of metals and other conductive materials, or other materials with conductive properties may also be adopted for the first gate electrode G1, the second gate electrode G2, and the third gate electrode G3.

The first gate insulating layer I1 electrically separates the first gate electrode G1 from the semiconductor layer CH. In some embodiments, a thickness IH1 of the first gate insulating layer I1 may be less than a thickness GH1 of the first gate electrode G1. Similarly, the second gate insulating layer I2 electrically separates the second gate electrode G2 and the third gate electrode G3 from the semiconductor layer CH. In some embodiments, the second gate insulating layer I2 may cover the second gate electrode G2 and the third gate electrode G3. In other words, a thickness IH2 of the second gate insulating layer I2 may be greater than a thickness GH2 of the second gate electrode G2, and the thickness IH2 of the second gate insulating layer I2 may be greater than a thickness GH3 of the third gate electrode G3. In addition, the thickness GH2 of the second gate electrode G2 may be the same as or different to the thickness GH3 of the third gate electrode G3. In some embodiments, the thickness IH2 of the second gate insulating layer I2 may be greater than the thickness IH1 of the first gate insulating layer I1. In some embodiments, the thickness GH1 of the first gate electrode G1, the thickness GH2 of the second gate electrode G2, and the thickness GH3 of the third gate electrode G3 may be the same. Moreover, the materials of the first gate insulating layer I1 and the second gate insulating layer I2 may include, but are not limited to, transparent insulating materials, such as silicon oxide, silicon nitride, silicon oxynitride, dielectric polymers, or stacked layers of the above materials.

In this embodiment, the thin film transistor 10 may also include a planarization layer 13. In addition, the planarization layer 13 may cover the first gate electrode G1, the semiconductor layer CH, the first gate insulating layer I1, and the second gate insulating layer I2. The material of the planarization layer 13 may include, but is not limited to, transparent insulating materials, such as acrylic, siloxane polymer, polyimide, epoxy, etc.

The thin film transistor 10 may also include the source electrode SE and the drain electrode DE. The source electrode SE is electrically connected to a first end E1 of the semiconductor layer CH, and the drain electrode DE is electrically connected to a second end E2 of the semiconductor layer CH. For example, in this embodiment, the source electrode SE may be electrically connected to the first end E1 of the semiconductor layer CH through a via VS in the planarization layer 13, and the drain electrode DE may be electrically connected to the second end E2 of the semiconductor layer CH through a via VD in the planarization layer 13. In some embodiments, the parts of the semiconductor layer CH that are connected to the source electrode SE and the drain electrode DE may also contain dopants, such as hydrogen, boron, or phosphorus, as needed. In some embodiments, the orthogonal projection of the second gate electrode G2 on the semiconductor layer CH may be located between an orthogonal projection of the source electrode SE on the semiconductor layer CH and the orthogonal projection of the first gate electrode G1 on the semiconductor layer CH. In addition, the orthogonal projection of the third gate electrode G3 on the semiconductor layer CH may be located between an orthogonal projection of the drain electrode DE on the semiconductor layer CH and the orthogonal projection of the first gate electrode G1 on the semiconductor layer CH.

Figure 3:
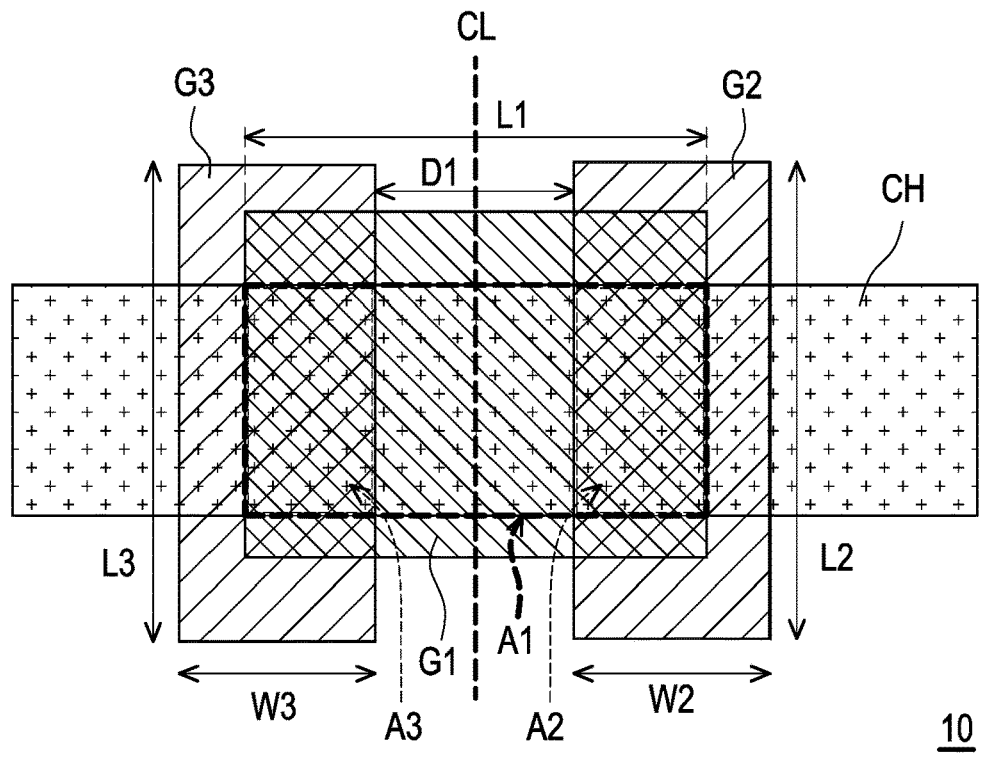
FIG. 3 is a schematic top view of the thin film transistor 10 as shown in FIG. 1.

FIG. 3 is a schematic top view of the thin film transistor 10 as shown in FIG. 1. In this embodiment, a distance D1 may be present between the second gate electrode G2 and the third gate electrode G3. In addition, the distance D1 may have a minimum of about 1.2 μm. In some embodiments, when being subject to exposure limits of a lithography process, the second gate electrode G2 and the third gate electrode G3 may be sequentially patterned by double exposure.

In some embodiments, a length L1 of the first gate electrode G1 may be between 4 μm and 20 μm, for example, 6 μm or 10 μm. In some embodiments, the second gate electrode G2 may have a length L2 and a width W2, and the third gate electrode G3 may have a length L3 and a width W3. In addition, the size of the second gate electrode G2 may be the same as the size of the third gate electrode G3. In other words, the length L2 may be the same as the length L3, and the width W2 may be the same as the width W3. In some embodiments, a central line CL of the first gate electrode G1 may be substantially overlapped with a central line between the second gate electrode G2 and the third gate electrode G3. When the second gate electrode G2 and the third gate electrode G3 have the same size, the central line between the second gate electrode G2 and the third gate electrode G3 is the axis of symmetry between the second gate electrode G2 and the third gate electrode G3.

As shown in FIG. 3, in this embodiment, a region A1 of the first gate electrode G1 may be overlapped with the semiconductor layer CH. A region A2 of the second gate electrode G2 may be overlapped with the semiconductor layer CH and the first gate electrode G1 at the same time. In addition, a region A3 of the third gate electrode G3 may be overlapped with the semiconductor layer CH and the first gate electrode G1 at the same time. The region A1 has an area a1, the region A2 has an area a2, and the region A3 has an area a3, where a ratio of the areas of the region A2 and the region A3 to the area of the region A1 is (a2 a3)/a1.

Figure 4:
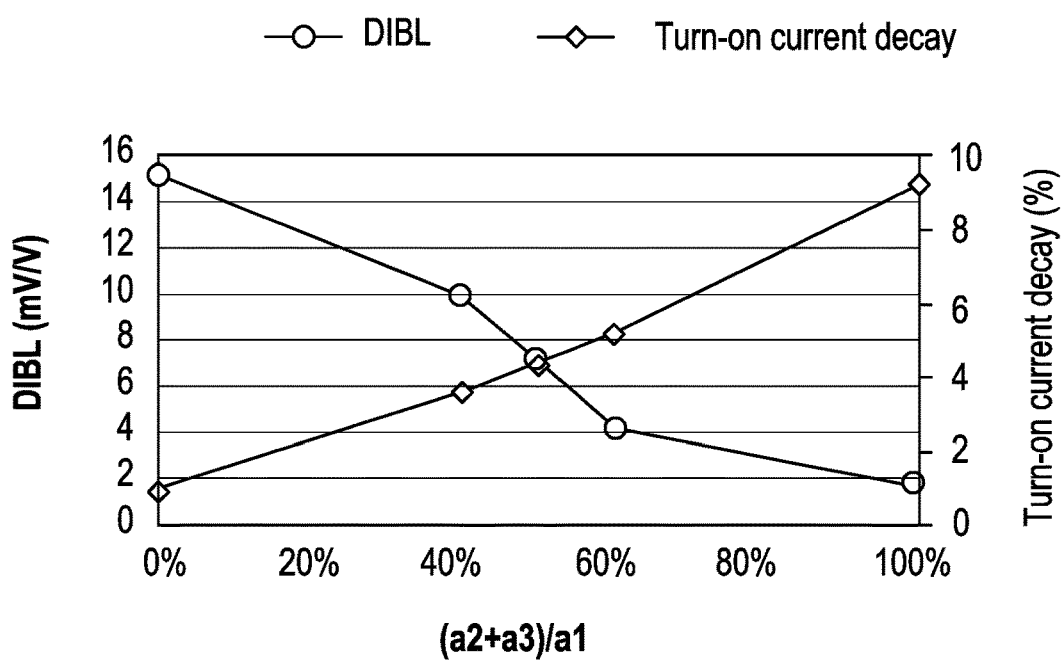
FIG. 4 is a curve chart showing changes of DIBL and turn-on current decay along with a change of (a2 a3)/a1 of the thin film transistor 10.

FIG. 4 is a curve chart showing changes of DIBL and turn-on current decay along with a change of (a2 a3)/a1 of the thin film transistor 10. As can be seen from FIG. 4, when (a2 a3)/a1 increases from 0% to 100%, DIBL can decrease from about 15 mV/V to less than 2 mV/V, which shows that increasing the overlapping area between the second gate electrode G2, the third gate electrode G3, and the first gate electrode G1 within the range of the semiconductor layer CH significantly suppresses DIBL, but increases the proportion of turn-on current decay from about 1% to 9%. Therefore, (a2 a3)/a1 may be set between 40% and 60% to balance between the performances of DIBL and turn-on current decay, so that DIBL of the thin film transistor 10 can be suppressed, while deterioration of the thin film transistor, which affects reliability, can be prevented.

In summary of the foregoing, in the thin film transistor of the disclosure, by disposing the separate second gate electrode and third gate electrode at the another side of the semiconductor layer opposite to the first gate electrode, DIBL can be suppressed, and influence on the reliability of the thin film transistor can be prevented.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A thin film transistor, comprising:
    a semiconductor layer;
    a first gate electrode disposed at one side of the semiconductor layer;
    a first gate insulating layer disposed between the first gate electrode and the semiconductor layer;
    a second gate electrode and a third gate electrode disposed at another side of the semiconductor layer, wherein the second gate electrode is separated from the third gate electrode;
    a second gate insulating layer disposed between the semiconductor layer, and the second gate electrode and the third gate electrode; and
    a planarization layer, covering the first gate electrode and in direct contact with the semiconductor layer,
    wherein an orthogonal projection of the first gate electrode on the semiconductor layer is partially overlapped with an orthogonal projection of the second gate electrode on the semiconductor layer, and the orthogonal projection of the first gate electrode on the semiconductor layer is partially overlapped with an orthogonal projection of the third gate electrode on the semiconductor layer.

2. The thin film transistor according to claim 1, wherein a ratio of a sum of an overlapping area of the second gate electrode with the semiconductor layer and with the first gate electrode and an overlapping area of the third gate electrode with the semiconductor layer and with the first gate electrode to an overlapping area of the first gate electrode with the semiconductor layer is between 40% and 60%.

3. The thin film transistor according to claim 1, wherein the first gate electrode, the second gate electrode, and the third gate electrode are electrically connected.

4. The thin film transistor according to claim 1, wherein a central line of the first gate electrode is overlapped with a central line between the second gate electrode and the third gate electrode.

5. The thin film transistor according to claim 1, wherein a size of the second gate electrode is the same as a size of the third gate electrode.

6. The thin film transistor according to claim 1, wherein the second gate insulating layer covers the second gate electrode and the third gate electrode.

7. The thin film transistor according to claim 1, wherein a thickness of the second gate insulating layer is greater than a thickness of the first gate insulating layer.

8. The thin film transistor according to claim 1, further comprising a source electrode, wherein the source electrode is electrically connected to one end of the semiconductor layer, and the orthogonal projection of the second gate electrode on the semiconductor layer is located between an orthogonal projection of the source electrode on the semiconductor layer and the orthogonal projection of the first gate electrode on the semiconductor layer.

9. The thin film transistor according to claim 8, further comprising a drain electrode, wherein the drain electrode is electrically connected to another end of the semiconductor layer, and the orthogonal projection of the third gate electrode on the semiconductor layer is located between an orthogonal projection of the drain electrode on the semiconductor layer and the orthogonal projection of the first gate electrode on the semiconductor layer.

10. The thin film transistor according to claim 1, wherein a minimum distance between the second gate electrode and the third gate electrode is 1.2 μm.

11. The thin film transistor according to claim 1, wherein a material of the semiconductor layer comprises an oxide semiconductor material, a silicon semiconductor material, or an organic semiconductor material.

* * * * *